United States Patent
Lee

(10) Patent No.: US 6,681,847 B1
(45) Date of Patent: Jan. 27, 2004

(54) RADIATOR FIN FORMED BY SINTERING OPERATION

(75) Inventor: Tzung-Lung Lee, Shi-Chi (TW)

(73) Assignee: Advanced Thermal Technologies (TW)

( * ) Notice: Subject to any disclaimer, the term of this patent is extended or adjusted under 35 U.S.C. 154(b) by 0 days.

(21) Appl. No.: 10/368,439

(22) Filed: Feb. 20, 2003

(51) Int. Cl.⁷ ................................................. F28F 7/00
(52) U.S. Cl. ................... 165/185; 165/80.3; 174/16.3; 257/722
(58) Field of Search ................ 165/80.3, 185; 361/697, 703, 704; 257/706, 722; 29/890.03; 174/16.3

(56) References Cited

U.S. PATENT DOCUMENTS

| | | | | | |
|---|---|---|---|---|---|
| 5,673,177 A | * | 9/1997 | Brodsky et al. | ............ | 361/704 |
| 5,771,966 A | * | 6/1998 | Jacoby | ........................ | 165/185 |
| 5,791,406 A | * | 8/1998 | Gonner et al. | .............. | 165/185 |
| 6,257,314 B1 | * | 7/2001 | Kuo | ............................ | 164/342 |
| 6,260,610 B1 | * | 7/2001 | Biber et al. | ................. | 165/80.3 |
| 6,263,956 B1 | * | 7/2001 | Tang et al. | ................. | 165/80.3 |
| 6,401,807 B1 | * | 6/2002 | Wyler et al. | ................. | 165/121 |
| 6,501,655 B1 | * | 12/2002 | Lee et al. | .................... | 361/703 |
| 2002/0007936 A1 | * | 1/2002 | Woerner et al. | ........... | 165/80.3 |

\* cited by examiner

*Primary Examiner*—Terrell McKinnon
(74) *Attorney, Agent, or Firm*—Browdy and Neimark, P.L.L.C.

(57) ABSTRACT

This invention relates to a radiator fin formed by sintering operation, which comprises a base board formed by means of powder metallurgical sintering and a radiator fin formed by the bent metal sheet. The base board has a plurality of equidistant trenches. The radiator fin is bent in the form of continued rectangles to form a hollow grille with multiple segments. The bottom segment of the radiator fin is milled into a slot, which is fit into the base board. The middle of the base of the said radiator fin is fit perfectly into the trench on the base board. By dint of skrinkage occurred during the sintering operation of the base board, and becomes an integral part of the base board.

4 Claims, 6 Drawing Sheets

RADIATOR FIN FORMED BY SINTERING OPERATION

FIELD OF THE INVENTION

The present invention relates to a radiator fin formed by sintering operation, which produces better heat conductive efficiency and great heat dissipation.

BACKGROUND OF THE INVENTION

Nowadays, with the rapid development of computing industry, the microprocessor chips and heat-generated electronic elements become less and less in size, but produce more and more heat in operation. In order to effectively dissipate the heat generated to the atmosphere so as to maintain the allowable temperature for the electronic elements to work in, a larger radiator fin is normally required to be attached on the surface of the electronic element to enhance its heat dissipation capability. As illustrated in FIG. 1, the prior art of the radiator fin is composed of a base board 10a and a radiator fin 20a, where the base board 10a is made of copper material and the radiator fin 20a is a copper sheet. The radiator fin 20a is rolled into continuous rectangles to form a hollow grille with multiple fins. The radiator fin 20a is bound with the thermal conductive glue 30a (as shown in FIG. 1) or welded onto the base board 10a to form an integrated assembly. The complete radiator fin assembly is further placed on the microprocessor chip and the heat generating electronic elements to help dissipate the resultant heat.

However, it is a well-known fact that there produces a thermal resistance between the base board 10a and the radiator fin 20a on the prior art of the radiator fin. It implies that the heat generated by the heat-generating elements is not significantly dissipated through the base board 10a to the radiator fin 20a. The low thermal conductivity can never satisfy the working circumstance in the computer industry.

Viewing from the above statement, practically it is obvious that there leaves a big room for improving the inconvenience and defects now existing on the prior art of the radiator fin.

For this reason, the inventor has devoted immense efforts to the research and development with theoretical application on the radiator fin and come up with this invention.

OBJECT OF THE INVENTION

The main object of the present invention is to provide an appropriate method where the sintering technology is employed to form the radiator fin which is further clamped into the base board to become an integral assembly with the least interface thermal resistance existing between the base board and the radiator fin, the heat generated from the heat-generating electronic elements can be easily and thoroughly dissipated from the base board to the radiator fin. It offers better thermal conductivity and greater heat dissipation.

To attain the aforesaid object, the present invention provides the employment of sinter technology to form the radiator fin, including a base board by the powder metallurgical formation and a radiator fin by press-rolling metal sheet. The base board has a plurality of equidistant trenches on the surface. The radiator fin is bent into continuous rectangles in the form of a hollow grille with multiple fins. The bottom segment of the radiator fin is milled into a slot to be fitted into the trench of the base board. In the sintering operation, the material of the base board presents a shrinkage, and the gap of the trench will be reduced considerably in size, just good enough to hold the radiator fin firmly in place and the radiator fin and the base board are therefore integrated. If the base board and the radiator fin are made of the same metal material, they will become an integral part after the sintering operation.

The features and technical implication of the invention is expounded in great details with the aid of some embodiments as illustrated in the attached drawings. However, the drawings are for reference only, not used as a restraint against the invention.

DETAILED DESCRIPTION OF THE INVENTION

As shown in FIGS. 2 through 6, the invention related to a radiator fin formed by sintering operation, comprising a base board 10 and a radiator fin 20, in which the base board 10 is made of copper or aluminum material with good thermal conductivity and fabricated by the powder metallurgical formation. The base board 10 as illustrated is in a rectangular form. It can be fabricated in any form as desired. The base board 10 has a plurality of equidistant trenches 11 on the surface.

The radiator fin 20 is made of copper or aluminum sheet having good thermal conductivity. The metal sheet is bent into continuous rectangles to form a hollow grille in an attempt to attain greater area. The radiator fin 20 contains continuously-linked top segments 21, intermediate segments 22 and bottom segments 23 where the top segments 21 are parallel with the bottom segments 23 and the intermediate segments 22 stand vertically among the top segments 21 and the bottom segments 23. The bottom segments 23 are milled with a slot 24 which exposes the tip of the intermediate segments 22. The intermediate segments 22 are coupling with the trench 11 on the base board 10.

After the base board 10 and the radiator fin 20 are independently fabricated, it is time to assembly them together as shown in FIG. 7. The slot 24 of the radiator fin 20 will straddle on the base board 10, and the tip of the intermediate segments 22 of the radiator fin 20 is inserted into the trench 11 of the base board 10. When both the radiator 20 and the base board 10 are under the process of the sintering operation, the shrinkage occurs in the base board material in the manner that the gap of the trench 11 on the base board 10 is hereby reduced considerably in size so as to clamp the radiator fin 20 firmly in place and the base board 10 and the radiator fins are therefore integrally formed. This is the way of how the radiator fin formed by sintering operation is fabricated as described in the invention.

As illustrated in FIG. 8, the top segment 21 of the radiator fin 20 is milled with another slot 25 for easy installation of a cooling fan (not shown in the drawing.)

The radiator fin of the invention is to be mounted on the top of the heat-generating electronic elements to enhance easy dissipation of heat. The radiator fin 20 is inserted in the base board 10 and the shrinkage taking place in the sintering operation will naturally reduce the gap of the trench 11 so the radiator fin 20 is firmly clamped therein and the base board 10 and the radiator fin 20 are integrally formed. If the material of the base board 10 uses the similar material as the radiator fin does, there would be the least interface thermal resistance. For this reason, the heat generated from the electronic element can be significantly transferred from the base board 10 to the radiator fin 20. The larger the area the radiator fin has, the more heat dissipation rate is attained.

The invention permits the use of aluminum material for making the base board and the copper material for the radiator fin. The shrinkage effect also takes place in the sintering operation and the radiator fin is clamped firmly by the base board in mechanical way, not a sintering way. Any material can be used to fabricate the base board as long as the melt point of the base board material is lower than the radiator fin material.

From the aforesaid statement, it is obvious that the invention has made a great improvement on the prior art of the radiator fin, which has thermal resistance generated between the base board and the radiator fin. Thus the heat produced by electronic thermal components can not be transferred completely from the bottom to the radiator fin, which influences the performance of heat conductivity. The product provided in the invention is in fact a novel and advanced electronic component, satisfying the patent requirement and justified for a grand patent to the inventor.

Many changes and modifications in the above disclosed embodiment of the invention can, of course, be carried out without departing from the scope thereof. Accordingly, to promote the progress in science and the useful arts, the invention is disclosed and is intended to be limited only by the scope of the appended claims.

BRIEF DESCRIPTION OF DRAWINGS

The drawings referred to in the statement are as follows.

Figure 1:
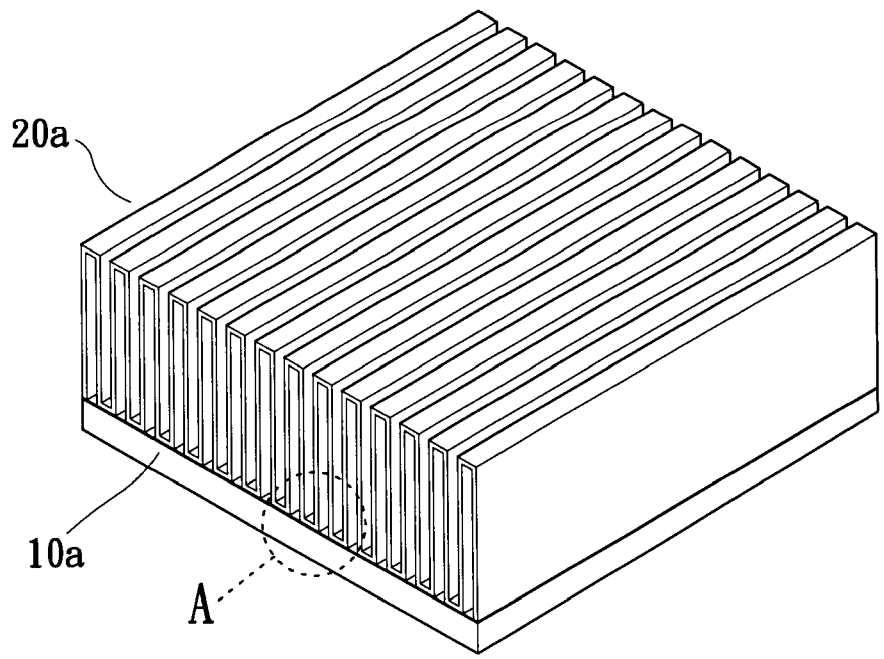
FIG. 1 is a stereo assembly of the prior art of the radiator fin.
Figure 1A:
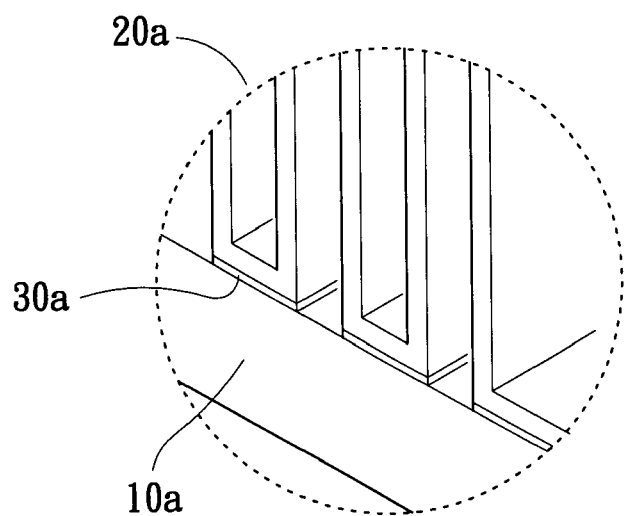
FIG. 1A is an enlargement of Portion A of the FIG. 1.
Figure 2:
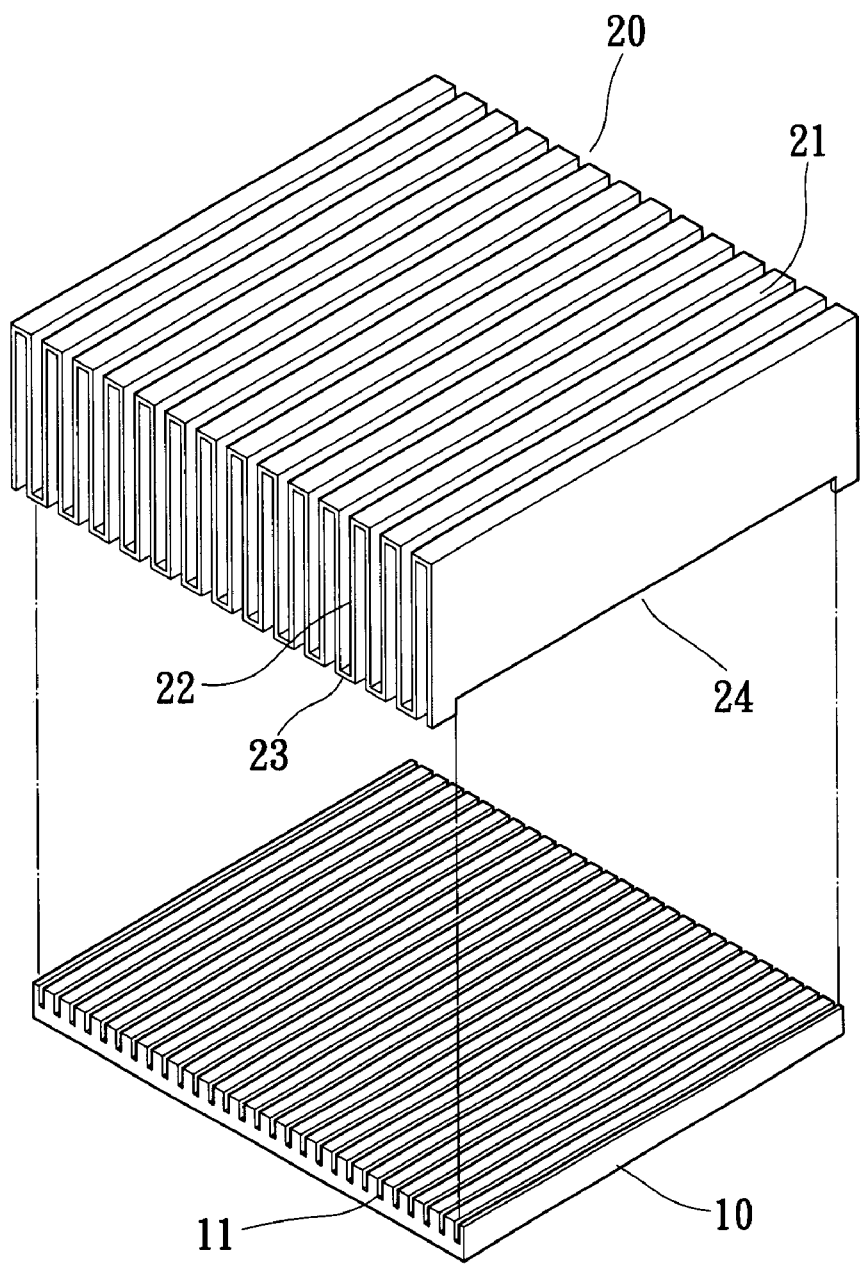
FIG. 2 is a stereo disassembly of the first embodiment of the invention.
Figure 3:
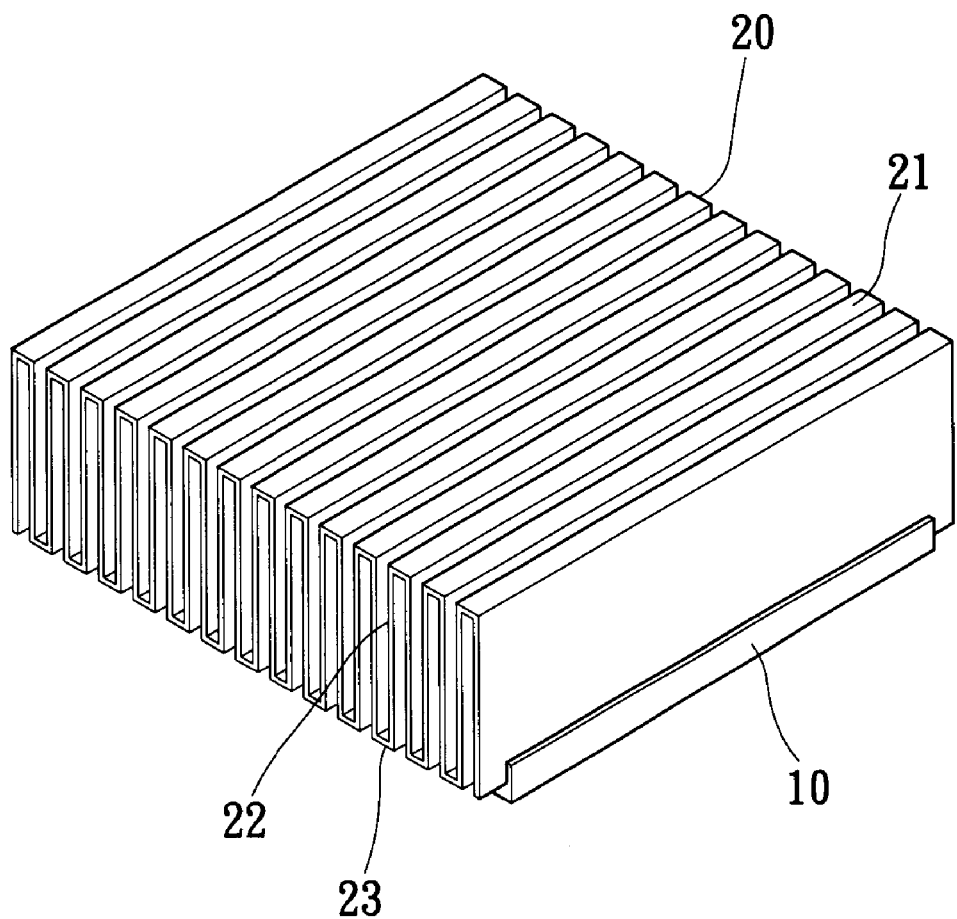
FIG. 3 is a stereo assembly of the first embodiment of the invention.
Figure 4:
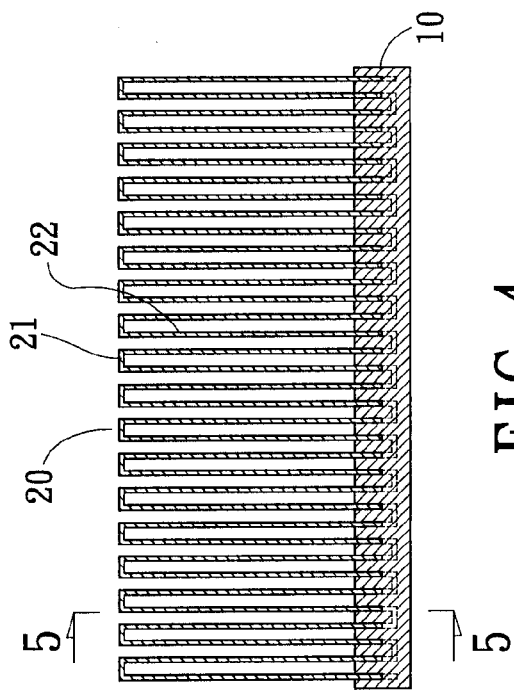
FIG. 4 is a cross section of the first embodiment of the invention.
Figure 6:
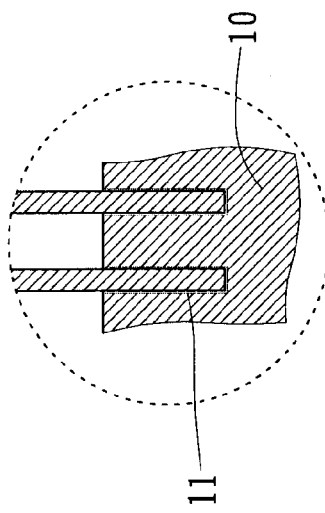
FIG. 6 is a partial enlargement of the invention.
Figure 5:
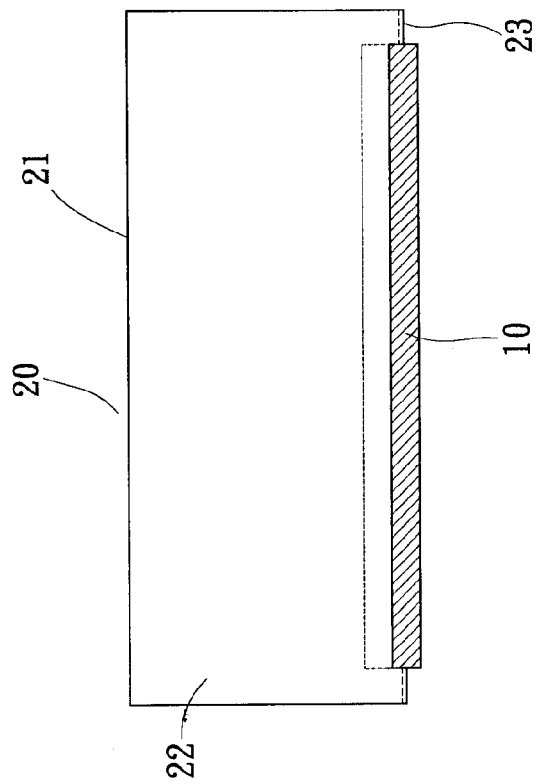
FIG. 5 is an enlargement of section 5—5 of FIG. 4.
Figure 7:
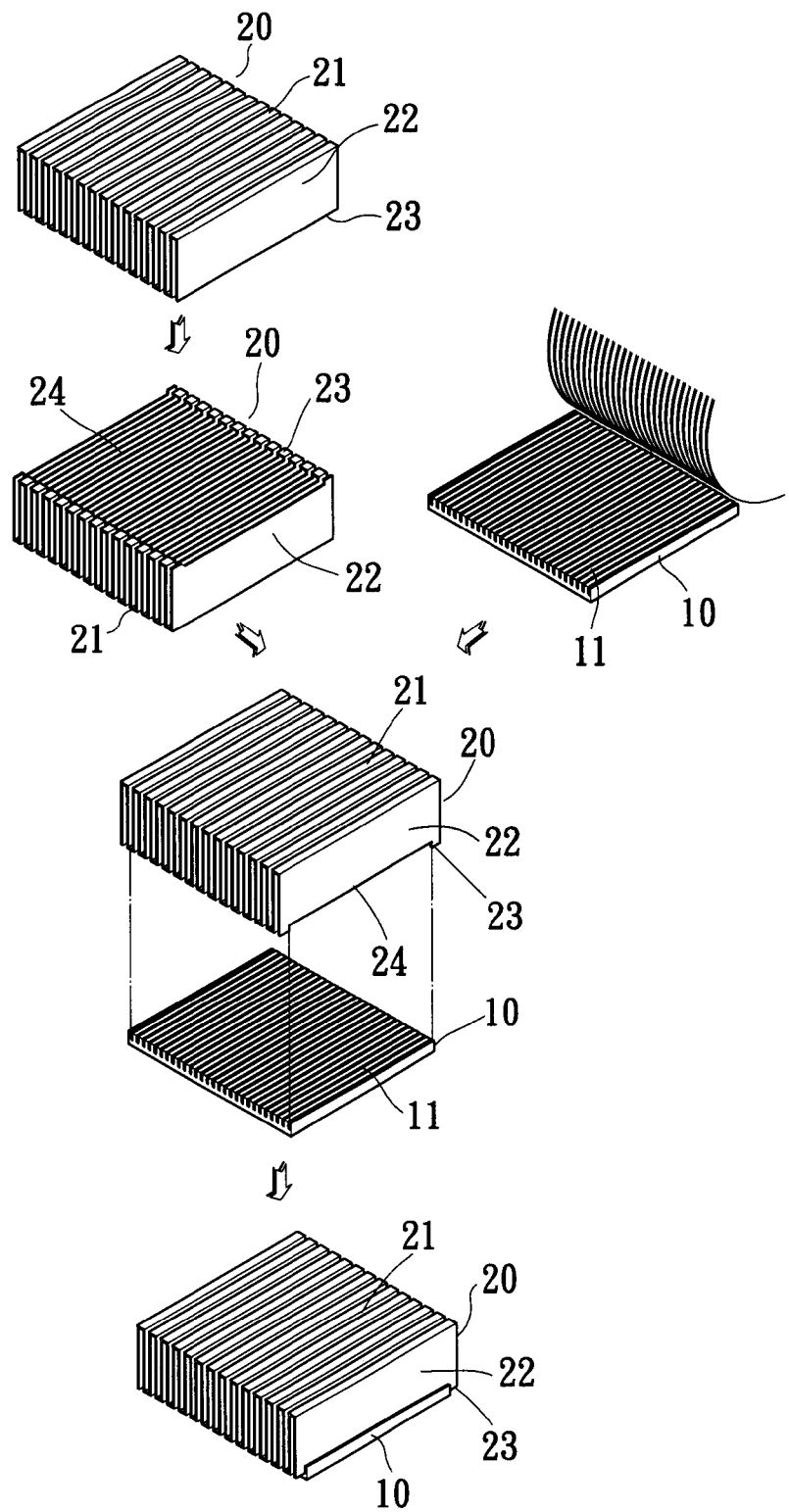
FIG. 7 is a schematic diagram showing the assembly flow of the invention.
Figure 8:
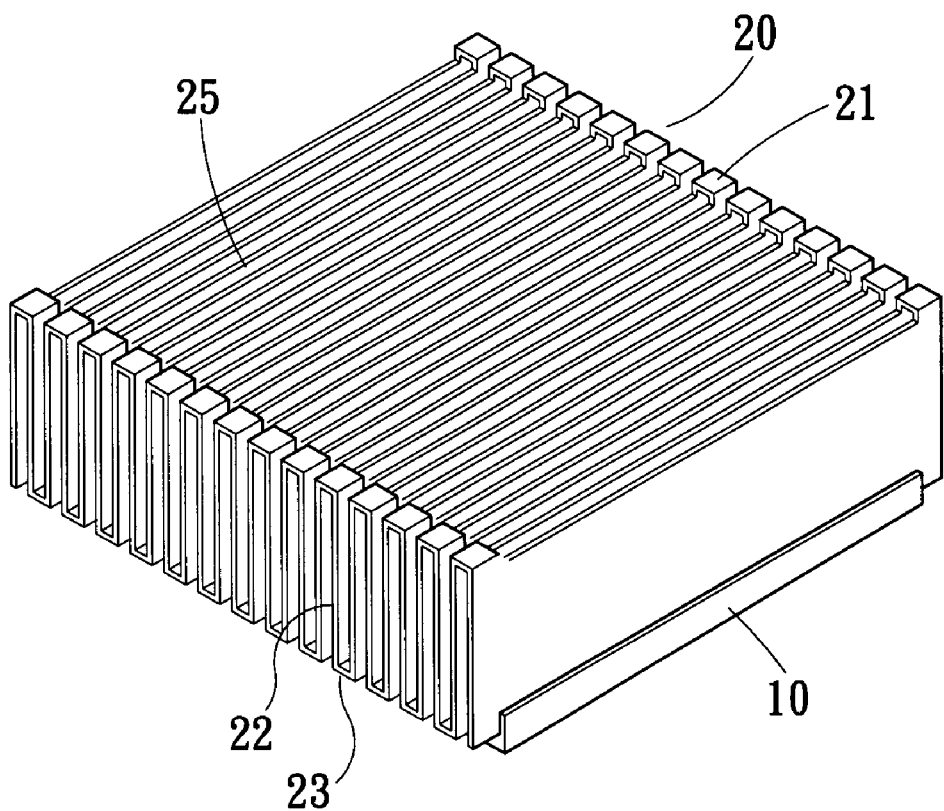
FIG. 8 is a stereo assembly of the second embodiment of the invention.

What is claimed is:

1. A radiator fin formed by sintering operating, comprising
   a base board made by the powder metallurgical formation with equidistant trenches on it surface;
   a radiator fin made of metal sheet press-rolled into a rectangle to form a plurality of grilles composed of a top segment, an intermediate segment and a bottom segment, the bottom segment of the radiator fin is milled into a slot which straddles on the base board, a tip of the intermediate segment is inserted into the trench of the base board, after the sintering operation, the material shrinkage of the base board will hold the radiator fin firmly in place and integrate the radiator fin and the base board.

2. The radiator fin formed by sintering operation of claim 1, wherein the base board and the radiator fin are made of copper or aluminum material.

3. The radiator fin formed by sintering operation of claim 1, wherein the top segment of the radiator fin is milled into a slot.

4. The radiator fin formed by sintering operation of claim 1, wherein if the base board and the radiator fin are made of the same metal material, both can be made an integral part by sintering operation.

* * * * *